United States Patent
Blasingame et al.

(10) Patent No.: US 10,165,696 B1
(45) Date of Patent: Dec. 25, 2018

(54) REMOVABLE MODULE WITH SPRING LATCH

(71) Applicant: Adtran, Inc., Huntsville, AL (US)

(72) Inventors: Clinton R. Blasingame, Huntsville, AL (US); Joseph Wesley Childers, Madison, AL (US); Benjamin C. Browning, Huntsville, AL (US)

(73) Assignee: Adtran, Inc., Huntsville, AL (US)

( * ) Notice: Subject to any disclaimer, the term of this patent is extended or adjusted under 35 U.S.C. 154(b) by 0 days.

(21) Appl. No.: 15/673,616

(22) Filed: Aug. 10, 2017

(51) Int. Cl.
*H05K 5/02* (2006.01)

(52) U.S. Cl.
CPC ......... *H05K 5/0221* (2013.01); *H05K 5/0208* (2013.01); *H05K 5/0204* (2013.01); *H05K 5/0213* (2013.01); *H05K 5/0247* (2013.01)

(58) Field of Classification Search
None
See application file for complete search history.

(56) References Cited

U.S. PATENT DOCUMENTS

| | | | | |
|---|---|---|---|---|
| 6,110,245 A * | 8/2000 | Schlag | ................ | B01D 46/001 454/184 |
| 6,185,097 B1 * | 2/2001 | Behl | ................ | G06F 1/20 361/695 |
| 6,556,437 B1 * | 4/2003 | Hardin | ................ | H05K 7/20172 361/679.48 |
| 6,611,427 B1 * | 8/2003 | Liao | ................ | F04D 25/166 165/121 |
| 6,776,706 B2 * | 8/2004 | Kipka | ................ | H05K 7/20181 361/695 |
| 6,865,078 B1 * | 3/2005 | Chang | ................ | H05K 7/20727 361/690 |
| 7,031,157 B2 * | 4/2006 | Horng | ................ | F04D 19/007 361/695 |
| 7,323,027 B1 * | 1/2008 | Fu | ................ | B01D 46/0005 55/385.6 |
| 7,522,415 B2 * | 4/2009 | Fan | ................ | F04D 29/601 312/236 |
| 7,589,968 B1 * | 9/2009 | Oliver | ................ | H05K 9/003 165/185 |
| 8,451,605 B2 * | 5/2013 | Chen | ................ | H05K 7/20172 361/679.48 |
| 8,619,423 B2 * | 12/2013 | Kim | ................ | B04C 3/00 361/694 |
| 8,784,167 B2 * | 7/2014 | Yi | ................ | H05K 7/20172 361/679.49 |
| 9,030,816 B2 * | 5/2015 | He | ................ | H05K 7/20172 361/679.47 |
| 9,506,375 B2 * | 11/2016 | Cachia | ................ | F04D 29/703 |
| 2002/0086574 A1 * | 7/2002 | Vinson | ................ | H01R 13/745 439/247 |

(Continued)

*Primary Examiner* — Xanthia C Cunningham
(74) *Attorney, Agent, or Firm* — Smith Tempel Blaha LLC; Michael J. Tempel

(57) ABSTRACT

An electronic module for engaging an electronic equipment enclosure may include a module body having a front face, at least one electronic device in the module body, and a resilient sheet-metal member connected to the module body. The resilient sheet-metal member may have a face portion substantially coextensive in area with the front face of the module body and may have a tab portion substantially perpendicular to the face portion. The tab portion may include a catch portion configured to engage a portion of the enclosure.

13 Claims, 5 Drawing Sheets

(56) References Cited

U.S. PATENT DOCUMENTS

| | | | | |
|---|---|---|---|---|
| 2003/0188847 A1* | 10/2003 | Lai | H05K 7/20172 | 165/80.2 |
| 2004/0247431 A1* | 12/2004 | Chen | F04D 29/601 | 415/182.1 |
| 2007/0053159 A1* | 3/2007 | Crippen | H05K 7/20172 | 361/695 |
| 2007/0155301 A1* | 7/2007 | Chen | H05K 7/20172 | 454/184 |
| 2009/0154092 A1* | 6/2009 | Chen | G06F 1/187 | 361/679.51 |
| 2010/0272578 A1* | 10/2010 | Zhang | G06F 1/181 | 416/244 R |
| 2011/0067836 A1* | 3/2011 | Tang | F04D 25/166 | 165/67 |
| 2011/0100600 A1* | 5/2011 | Tang | H01L 23/467 | 165/96 |
| 2011/0157817 A1* | 6/2011 | Li | G06F 1/20 | 361/679.48 |
| 2011/0216498 A1* | 9/2011 | Lee | G06F 1/20 | 361/679.33 |
| 2012/0033376 A1* | 2/2012 | Chen | G06F 1/183 | 361/679.48 |
| 2012/0076649 A1* | 3/2012 | Ye | F04D 25/0613 | 415/213.1 |
| 2012/0113591 A1* | 5/2012 | Chuang | H05K 7/20172 | 361/695 |
| 2012/0114477 A1* | 5/2012 | Li | F04D 25/0613 | 415/213.1 |
| 2012/0156019 A1* | 6/2012 | Gong | G06F 1/20 | 415/182.1 |
| 2012/0190289 A1* | 7/2012 | Wei | F04D 25/0613 | 454/251 |
| 2012/0267489 A1* | 10/2012 | Zhang | H01R 13/506 | 248/201 |
| 2013/0023199 A1* | 1/2013 | Li | H05K 7/20172 | 454/355 |
| 2013/0149168 A1* | 6/2013 | Sun | H05K 7/20172 | 416/244 R |
| 2013/0240183 A1* | 9/2013 | Sun | H05K 7/20172 | 165/121 |
| 2014/0029191 A1* | 1/2014 | Terwilliger | G06F 1/20 | 361/679.31 |
| 2014/0233185 A1* | 8/2014 | Wen | H05K 7/20172 | 361/695 |
| 2015/0167691 A1* | 6/2015 | Chen | H05K 7/20172 | 415/108 |
| 2015/0282384 A1* | 10/2015 | Ho | H05K 7/20172 | 361/695 |
| 2015/0338726 A1* | 11/2015 | Kadotani | G03B 21/145 | 353/57 |
| 2015/0351280 A1* | 12/2015 | Gonzalez Inda | H05K 7/20172 | 361/695 |
| 2016/0029519 A1* | 1/2016 | Chen | H05K 7/20727 | 361/679.48 |
| 2016/0198581 A1* | 7/2016 | Caille | H02G 3/123 | 174/50 |
| 2016/0234966 A1* | 8/2016 | Li | H05K 7/20172 | |
| 2017/0114803 A1* | 4/2017 | Miwa | H05K 7/20172 | |

\* cited by examiner

REMOVABLE MODULE WITH SPRING LATCH

BACKGROUND

Electronic equipment may be enclosed within a generally box-shaped chassis, housing, or similar enclosure. Such an enclosure may be configured to retain one or more removable modules, such as, for example, a fan module for ventilating the interior of the enclosure. A module may include electromagnetic shielding, such as an electromagnetic interference (EMI) skirt. The exterior of the enclosure may have one or more openings that define bays configured to receive modules. A user may insert a module into one of the openings and slide the module into the bay. The module may include a latch. The engagement of the latch retains the module in the bay, i.e., it resists removal of the module from the enclosure. The latch commonly includes a resilient member that flexes, compresses, or otherwise provides a spring force that engages or disengages a latching mechanism. The latch includes a user-operable portion that the user may operate to disengage the latch. Disengagement of the latch enables a user to remove the module from the enclosure by pulling the module in the opposite direction from which the module was inserted.

Spring latches of removable modules commonly comprise multiple moving parts. Such mechanical complexity contributes to manufacturing cost. It would be desirable to provide a removable module having a more economical spring latch.

SUMMARY

In an exemplary embodiment, an electronic module for engaging an electronic equipment enclosure may include a module body having a front face, at least one electronic device in the module body, and a resilient sheet-metal member connected to the module body. The resilient sheet-metal member may have a face portion substantially coextensive in area with the front face of the module body and may have a tab portion substantially perpendicular to the face portion. The tab portion may include a catch portion that defines an edge substantially parallel to the face portion.

In an exemplary method for using the above-described electronic module, a user may grasp a portion of the module body and insert the electronic module into a module bay in the electronic equipment enclosure until the edge of the catch portion resiliently engages an opening in a sidewall of the module bay.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
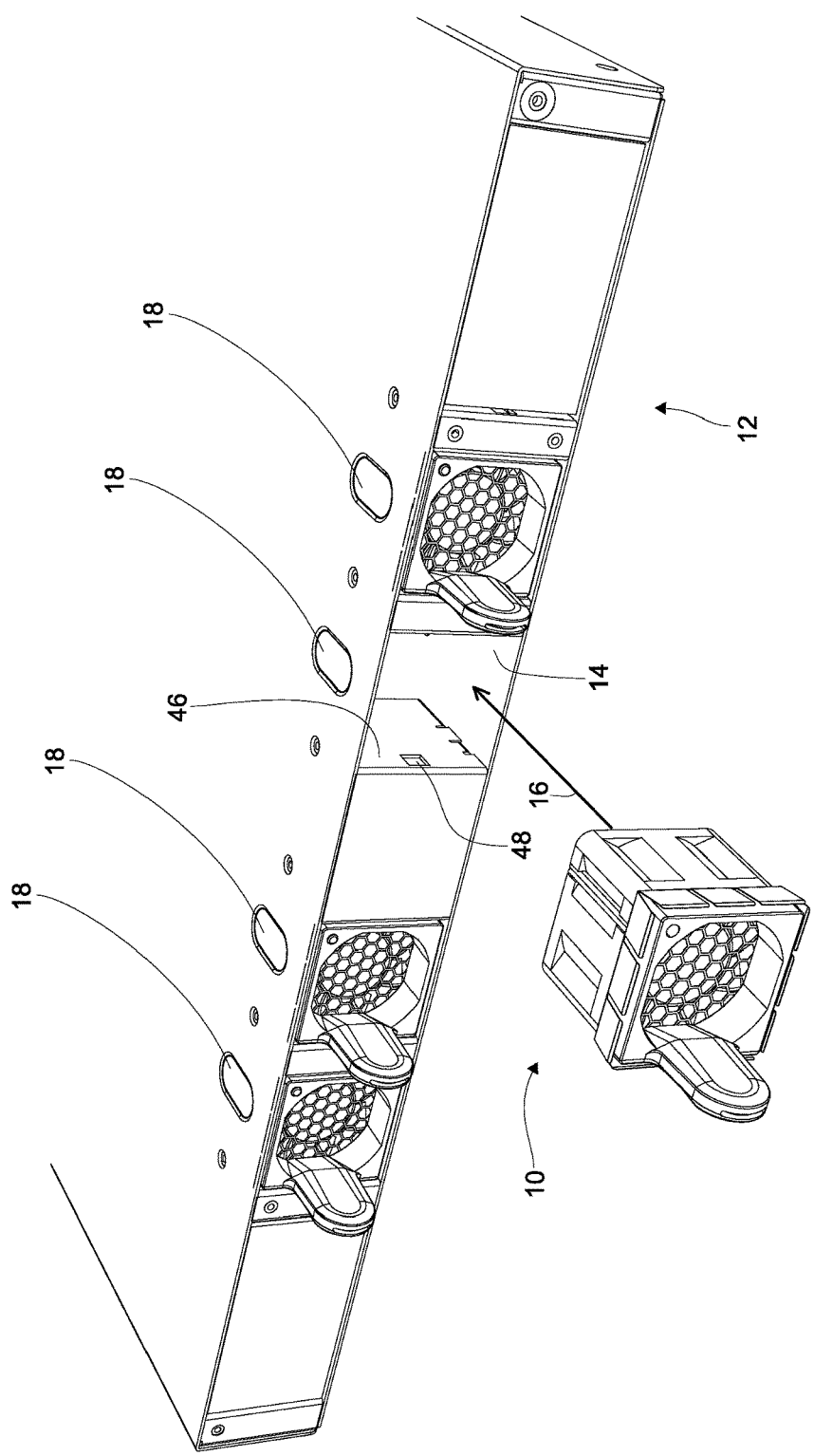
FIG. 1 is a perspective view of an electronic equipment enclosure and removable modules having spring latches, in accordance with an exemplary embodiment.

As illustrated in FIG. 1, in an illustrative or exemplary embodiment, an electronic module 10 may be received in an electronic equipment enclosure 12. Although in the illustrated embodiment enclosure 12 is generally box-shaped (having six rectangular sides), in other embodiments such an electronic equipment enclosure may have any shape. Electronic module 10 may be received in a bay 14 of enclosure 12 generally in the direction indicated by the arrow 16. Bay 14 may have a generally rectangular cross-sectional shape defined by one or more sidewalls 46 or other structures. For convenience, the direction indicated by arrow 16 may be referred to as an axial or longitudinal direction, in reference to an axis or direction in which bay 14 is elongated. Such a direction is generally normal to one of the sides of enclosure 12. Enclosure 12 may have air vent openings 18 or other features of types commonly included in electronic equipment enclosures. In the exemplary embodiment illustrated in FIGS. 1-5, electronic module 10 may be a fan module. Nevertheless, in other embodiments such an electronic module may be any other type of user-removable, latching module containing electronic, electrical, or electro-mechanical components. Any number of such electronic modules 10 may be received in any corresponding number of bays 14.

Figure 3:
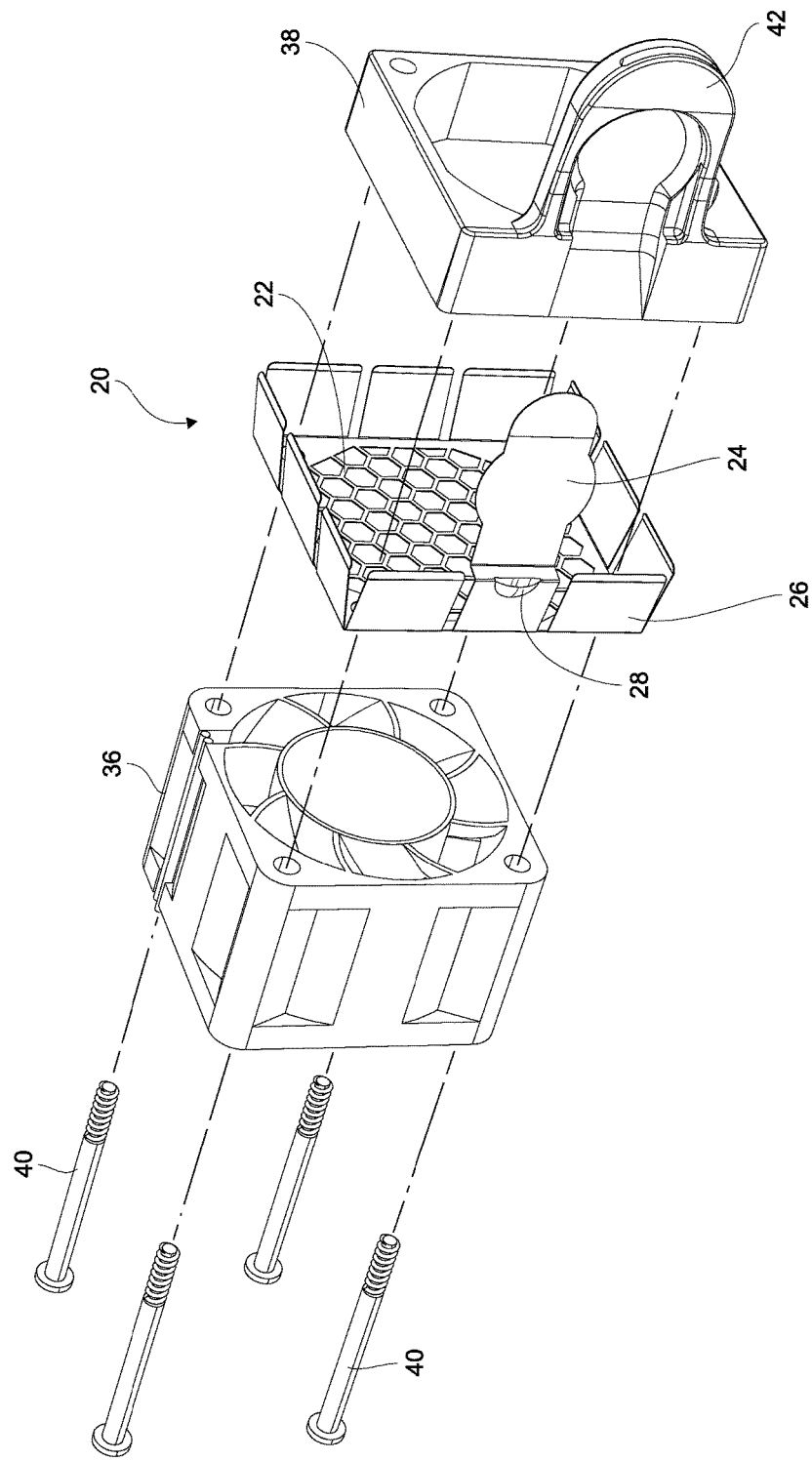
FIG. 3 is an exploded view of the removable module of FIG. 2.
Figure 4:
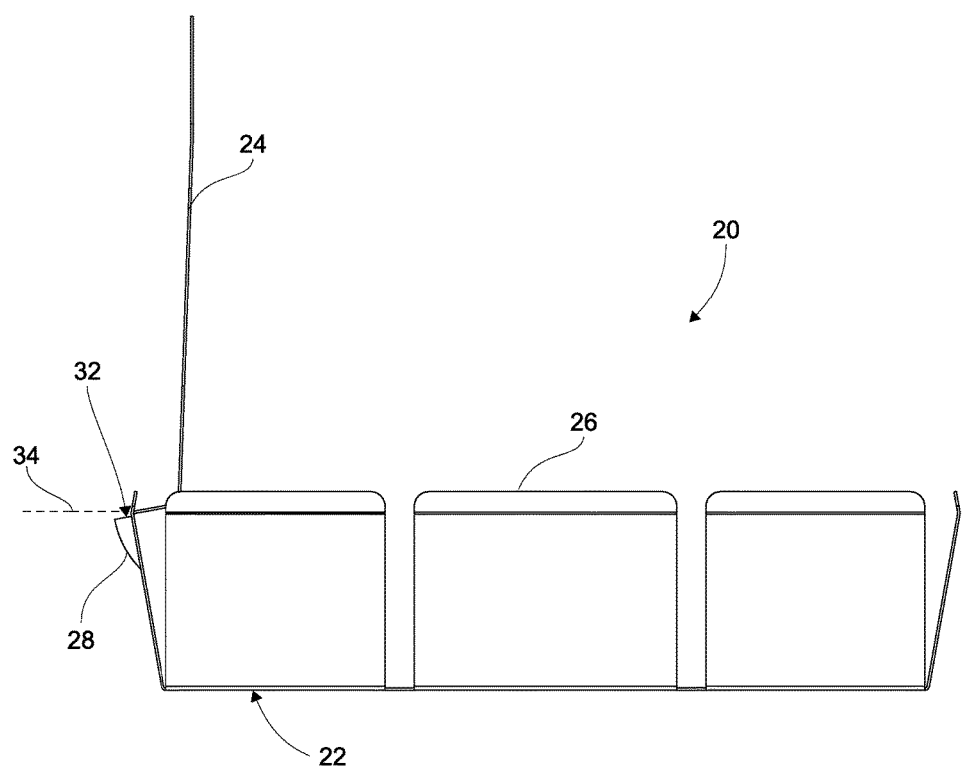
FIG. 4 is a side elevation view of a resilient sheet-metal member of the removable module of FIGS. 2-3.

As illustrated in FIG. 3, electronic module 10 may include a resilient sheet-metal member 20. Resilient sheet-metal member 20 has a face portion 22. Face portion 22 has a multiplicity of holes or perforations that form a ventilation or airflow screen, mesh, grating, etc. Face portion 22 also has a tab portion 24 that is substantially perpendicular to face portion 22. The term "substantially perpendicular" is used herein to mean that the angle between face portion 22 and tab portion 24 need not be exactly 90 degrees for the structure to function in the manner described herein. For example, the angle may be deviate up to about 45 degrees from perpendicular. The term "substantially perpendicular" also contemplates that in other embodiments (not shown) tab portion 24 may not be entirely planar due to having features such as one or more bends, contours, etc.

Resilient sheet-metal member 20 has an electromagnetic interference (EMI) skirt portion 26 surrounding a periphery of face portion 22. As face portion 22 is rectangular in the illustrated embodiment, EMI skirt portion 26 is correspondingly rectangular. EMI skirt portion 26 extends substantially perpendicularly to face portion 22. Note that EMI skirt portion 26 is angled slightly outwardly, i.e., away from the periphery of face portion 22, consistently with the meaning of "substantially" perpendicularly. That is, each of the four sides of EMI skirt portion 26 may be oriented at an angle slightly less than 90 degrees, such as about 60 to 80 degrees, to face portion 22. As understood by one of ordinary skill in the art, when electronic module 10 is retained in bay 14, the sidewalls of bay 14 squeeze or resiliently flex EMI skirt portion 26 to aid forming an EMI seal. EMI skirt portion 26 comprises a plurality of skirt fingers separated by notches to enable the aforementioned flexure of EMI skirt portion 26.

Note that tab portion 24 of resilient sheet-metal member 20 extends from only one of the skirt fingers.

Figure 2:
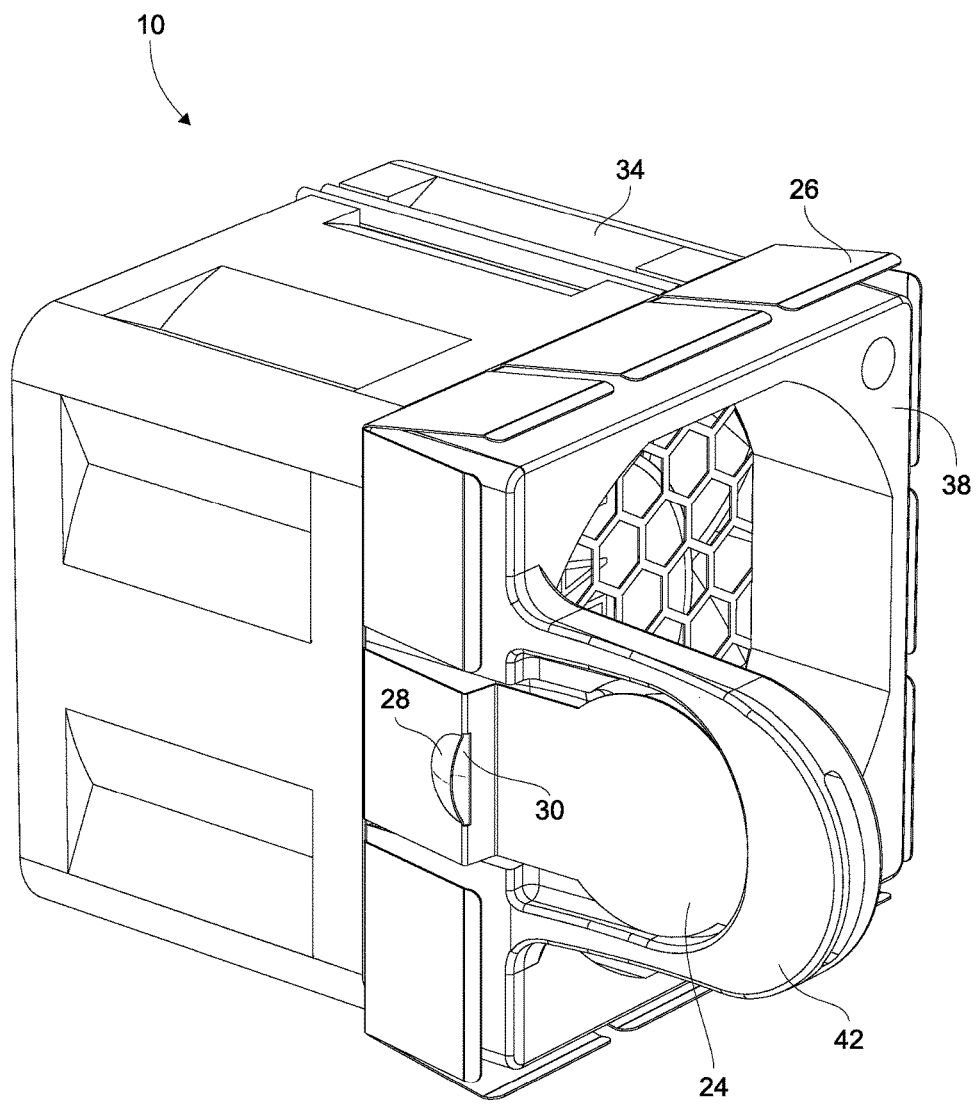
FIG. 2 is a perspective view of one of the removable modules, in accordance with an exemplary embodiment.

As illustrated in FIGS. 2-3, tab portion 24 has a catch portion 28. Catch portion 28 may comprise a generally semi-dome-shaped bump in resilient sheet-metal member 20. Catch portion 28 (i.e., the bump) may be formed by cutting or otherwise forming a slit in resilient sheet-metal member 20 that is then formed into an arcuate opening 30 (FIG. 2) by pressing a region of resilient sheet-metal member 20 adjacent to the slit until the slit bows into an arcuate shape and the region rises into a semi-dome shape. The term "semi-dome-shaped" is used for clarity of description and is not intended to limit the shape of catch portion 28 with geometric precision.

The periphery of arcuate opening 30 of catch portion 28 defines an edge 32 (FIG. 4), which may lie substantially in a plane 34. Note that plane 34 is substantially parallel to face portion 22. That edge 32 is oriented in this direction aids the latching action, as described below.

Electronic module 10 may further include a fan assembly 36. Although in the illustrated embodiment electronic module 10 includes fan assembly 36, in other embodiments (not shown), such an electronic module may include other types of electronic devices instead of or in addition to a fan.

Electronic module 10 includes a module body, which in the illustrated embodiment may comprise a faceplate 38 and related mechanical elements, such as screws 40 (FIG. 3). The foregoing elements of electronic module 10 may be assembled together in any manner. For example, screws 40 (FIG. 3) may interconnect fan assembly 34, resilient sheet-metal member 20, and faceplate 38. In the illustrated embodiment electronic module 10 thus comprises the module body (e.g., faceplate 38, etc.), resilient sheet-metal member 20, and fan assembly 36. The module body may include additional mechanical structures that are not shown for purposes of clarity. Electrical wiring, electrical connectors, etc., are also not shown for purposes of clarity. Fan assembly 36 may be powered in any manner, such as through an electrical connection with a power supply in enclosure 12. The front of faceplate 38 may define a front face of the module body and a front face of electronic module 10.

Note that face portion 22 of resilient sheet-metal member 20 is substantially coextensive in area with a periphery of faceplate 38. Faceplate 38 has a central opening aligned with a region of face portion 22 to provide an airflow path. In operation, fan assembly 36 moves air through face portion 22 and through the opening in faceplate 38. Fan assembly 36 may be configured to move air in either of the two possible airflow directions (i.e., the direction indicated by arrow 16 in FIG. 1 or the opposite direction).

Electronic module 10 may have a handle 42 that is formed with or otherwise connected to faceplate 38. Handle 42 at least partly encloses tab portion 24 and provides a convenient structure for a user to grasp while protecting the user's fingers against contact with sharp edges of tab portion 24.

Figure 5:
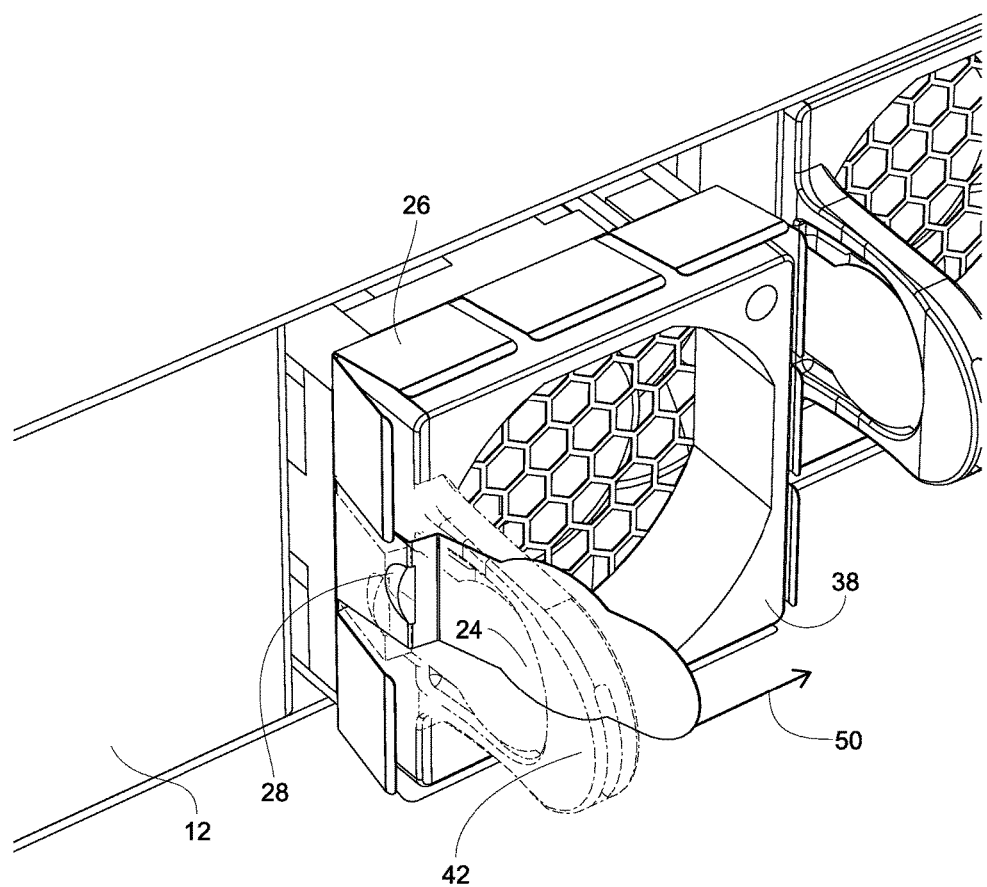
FIG. 5 is a perspective view of a portion of the removable module of FIGS. 2-4, illustrating operation of the spring latch.

As illustrated in FIG. 5, a method for using above-described electronic module 10 for engaging above-described enclosure 12 may include a user grasping a portion of the module body of electronic module 10, such as handle 42 (shown in phantom line in FIG. 5). Grasping handle 42 or other such portion of electronic module 10, the user inserts electronic module 10 into one of bays 14 in the direction indicated by arrow 16 (FIG. 1). As electronic module 10 is inserted, EMI skirt portion 26 contacts sidewalls 46 of bay 14. Due to the slight outward angle at which the skirt fingers of EMI skirt portion 26 are oriented, the contact with sidewall 46 resiliently compresses skirt portion 26. More specifically, each skirt finger is resiliently flexed and displaced inwardly. Catch portion 28, which is formed in one of the skirt fingers, is thus also flexed and displaced inwardly. This displacement of catch portion 28 provides the resilient loading or spring force involved in the latching action. As electronic module 10 is still further inserted, catch portion 28 slides against one of sidewalls 46 until it aligns with a pocket or opening 48 (see FIG. 1) in the sidewall 46 and resiliently snaps into opening 48. In this engaged or latched position, edge 32 (see FIG. 4) engages a portion of the periphery of opening 48 and thus aids retention of electronic module 10 in enclosure 12. In this engaged or latched position, the inwardly flexed or displaced skirt fingers are nearly exactly perpendicular to face portion 22, and edge 32 is thus nearly exactly parallel to face portion 22.

The method may further include the user pressing tab portion 24 in the direction indicated by the arrow 50 in FIG. 5, which may be referred to for convenience as a lateral direction. (Note that the lateral direction is perpendicular to the axial direction indicated by arrow 16 in FIG. 1.) The force exerted by the user flexes and resiliently loads tab portion 24. The displacement of tab portion 24 from its un-flexed or relaxed position to the resiliently flexed (i.e., spring-loaded) position shown in FIG. 5 lifts catch portion 28 out of its above-described engagement with opening 48. Note that tab portion 24 is enclosed loosely enough within handle 42 that tab portion 24 has room to flex in this manner. Once catch portion 28 has disengaged opening 48, the user may grasp handle 42 and pull electronic module 10 out of bay 14 in a direction opposite the direction indicated by arrow 16 (FIG. 1). When the user ceases to press tab portion 24, catch portion 28 resiliently returns to its relaxed position, indicated in phantom line in FIG. 5.

It may be appreciated that the resilient bends or interfaces between face portion 22 and the skirt fingers contribute to the above-described operational characteristics. More specifically, the resilient bends or interfaces contribute to both the EMI sealing and the latching action. As face portion 22 is fixedly connected to the module body (e.g., fan assembly 36 and faceplate 38), face portion 22 provides a common structure against which tab portion 24 may exert a resilient or spring force and against which EMI skirt portion 26 may exert a resilient force.

One or more illustrative or exemplary embodiments of the invention have been described above. However, it is to be understood that the invention is defined by the appended claims and is not limited to the specific embodiments described.

What is claimed is:

1. An electronic module for engaging an electronic equipment enclosure, comprising:
   a module body having a front face;
   at least one electronic device coupled to the module body; and
   a resilient sheet-metal member connected to the module body, the resilient sheet-metal member having a face portion substantially coextensive in area with the front face of the module body, having a tab portion resiliently connected to and substantially perpendicular to the face portion, and having a skirt portion resiliently connected to and surrounding a periphery of the face portion and extending substantially perpendicularly to the face portion, the skirt portion comprising a plurality of skirt fingers with notches separating the plurality of skirt fingers from each other, the tab portion extending from only one of the skirt fingers and having a catch portion, the catch portion having an edge substantially parallel to the face portion, the edge configured to engage a portion of the electronic equipment enclosure.

2. The electronic module of claim 1, wherein the at least one electronic device comprises a fan.

3. The electronic module of claim 2, wherein the face portion has a multiplicity of airflow perforations.

4. The electronic module of claim 1, wherein the catch portion comprises a bump.

5. The electronic module of claim 4, wherein the bump is semi-domed-shaped, and an opening through the resilient sheet-metal member defines a planar region of the semi-domed-shaped bump.

6. The electronic module of claim 1, wherein the front face of the module body comprises a front of a faceplate having a central opening aligned with a region of the airflow perforations.

7. The electronic module of claim 6, further comprising a handle connected to the faceplate, the handle at least partly enclosing the tab portion.

8. An electronic module for engaging an electronic equipment enclosure, comprising:
    a faceplate;
    a fan coupled to the faceplate; and
    a resilient sheet-metal member connected to the faceplate, the resilient sheet-metal member having a face portion substantially coextensive in area with the faceplate and having a tab portion resiliently connected to and substantially perpendicular to the face portion, the tab portion having catch portion defining an edge substantially parallel to the face portion, the face portion having a multiplicity of airflow perforations, the faceplate having a central opening aligned with a region of the airflow perforations; and
    a handle connected to the faceplate, the handle at least partly enclosing the tab portion.

9. The electronic module of claim 8, wherein the resilient sheet-metal member has a skirt portion resiliently connected to and surrounding a periphery of the face portion and extending substantially perpendicularly to the face portion.

10. The electronic module of claim 9, wherein the tab portion extends from the skirt portion.

11. The electronic module of claim 10, wherein the catch portion comprises a bump.

12. The electronic module of claim 11, wherein the bump is semi-domed-shaped, and an opening through the resilient sheet-metal member defines a planar region of the semi-domed-shaped bump.

13. The electronic module of claim 12, wherein:
    the skirt portion comprises a plurality of skirt fingers with notches separating the plurality of skirt fingers from each other; and
    the tab portion extends from only one of the skirt fingers.

* * * * *